US012080941B2

(12) United States Patent
Kim et al.

(10) Patent No.: US 12,080,941 B2
(45) Date of Patent: Sep. 3, 2024

(54) SIGNAL TRANSFERRING DEVICE AND MULTIPLEXER USING MAGNETIC THIN FILM STRUCTURES

(71) Applicant: Samsung Electronics Co., Ltd., Suwon-si (KR)

(72) Inventors: Sang Koog Kim, Seongnam-si (KR); Young Jun Cho, Hwaseong-si (KR); Gwan Hyeob Koh, Suwon-si (KR); Kil Ho Lee, Suwon-si (KR); Jun Hoe Kim, Suwon-si (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 433 days.

(21) Appl. No.: 17/523,027

(22) Filed: Nov. 10, 2021

(65) Prior Publication Data

US 2022/0158337 A1    May 19, 2022

(30) Foreign Application Priority Data

Nov. 16, 2020  (KR) .................. 10-2020-0152816
Nov. 16, 2020  (KR) .................. 10-2020-0152817

(51) Int. Cl.
*H01Q 1/38* (2006.01)
*G11C 11/16* (2006.01)
(Continued)

(52) U.S. Cl.
CPC .............. *H01Q 1/38* (2013.01); *G11C 11/16* (2013.01); *H01F 10/14* (2013.01); *H01F 38/14* (2013.01);
(Continued)

(58) Field of Classification Search
None
See application file for complete search history.

(56) References Cited

U.S. PATENT DOCUMENTS 6,807,092 B1 * 10/2004 Braun .................. H10N 50/10
365/158
7,187,578 B2 * 3/2007 Hong .................... G11C 11/16
365/158

(Continued)

FOREIGN PATENT DOCUMENTS

KR   10-2007-0036673 A   4/2007
KR   10-2016-0004838 A   1/2016

OTHER PUBLICATIONS

Young-Jun Cho, "Dynamics of Magnetic Vortices Coupled in Magnetic Disk Array," Department of Materials Science and Engineering Graduate School Seoul National University, Feb. 2020.
(Continued)

*Primary Examiner* — Wilson Lee
(74) *Attorney, Agent, or Firm* — Harness, Dickey & Pierce, P.L.C.

(57) ABSTRACT

A signal transferring device includes a first structure that includes a first magnetic thin film structure having a first magnetic vortex configured to receive a signal as an input signal, a second structure that is spaced apart from at least one side of the first structure, the second structure including a second magnetic thin film structure having a second magnetic vortex configured to transfer the signal, and a third structure that is spaced apart from at least one side of the second structure, the third structure including a third magnetic thin film structure having a third magnetic vortex configured to output the signal from the signal transferring device. The first and third structures have a symmetrical shape and the second structure has an asymmetrical shape.

18 Claims, 15 Drawing Sheets

(51) Int. Cl.
  *H01F 10/14*    (2006.01)
  *H01F 38/14*    (2006.01)
  *H04B 5/26*     (2024.01)
  *H04L 27/26*    (2006.01)

(52) U.S. Cl.
  CPC ......... *H04B 5/26* (2024.01); *H01F 2038/143* (2013.01); *H04L 27/2636* (2013.01)

(56) References Cited

U.S. PATENT DOCUMENTS

| | | | | |
|---|---|---|---|---|
| 2004/0094778 | A1* | 5/2004 | Ooishi | G11C 29/021 |
| | | | | 257/202 |
| 2004/0219956 | A1* | 11/2004 | Iwai | H01Q 5/00 |
| | | | | 455/575.3 |
| 2008/0231392 | A1 | 9/2008 | Kim et al. | |
| 2017/0277046 | A1* | 9/2017 | Leung | G02B 6/02214 |
| 2020/0075233 | A1* | 3/2020 | Lekas | H02J 50/005 |
| 2021/0099027 | A1* | 4/2021 | Larsson | H02J 50/80 |
| 2022/0393349 | A1* | 12/2022 | Lee | H04B 7/0413 |

OTHER PUBLICATIONS

Korean Office Action dated Oct. 20, 2021 for corresponding Korean Application No. 10-2020-0152817.

* cited by examiner

| Input | Select | Output 1 | Output 2 |
|---|---|---|---|
| 0 | 0 | 0 | 0 |
| 0 | 1 | 0 | 0 |
| 1 | 0 | 1 | 0 |
| 1 | 1 | 0 | 1 |

SIGNAL TRANSFERRING DEVICE AND MULTIPLEXER USING MAGNETIC THIN FILM STRUCTURES

CROSS-REFERENCE TO RELATED PATENT APPLICATIONS

This application claims the benefit under 35 U.S.C. § 119 of Korean Patent Application No. 10-2020-0152816, filed on Nov. 16, 2020 in the Korean Intellectual Property Office, and Korean Patent Application No. 10-2020-0152817, filed on Nov. 16, 2020 in the Korean Intellectual Property Office, the disclosures of each of which are incorporated herein in their entirety by reference.

BACKGROUND

1. Field

The present inventive concepts relate to a signal transferring devices and multiplexers using magnetic thin film structures and, more particularly, to signal transferring devices using magnetic thin film structures having low energy consumption and easily-controllable wave characteristics, and multiplexers using magnetic thin film structures capable of performing multiplexing/demultiplexing.

2. Description of the Related Art

Data signal multiplexing is a core function that is broadly used for data transmission in communication technology together with computer networks. In various fields of data transmission, it is desired to transmit multiple data signals through a single transmission line. In addition, as means for efficiently transmitting signals through circuits, the possibility of time division and frequency division has been experimentally demonstrated.

Meanwhile, to replace complementary metal-oxide-semiconductor (CMOS)-based data processing methodology, instead of a data processing method depending on motion of electrons, i.e., charges, a data processing method using spins which are quantum characteristics of electrons is being studied. For example, research is being conducted on a magnetic quantum-dot cellular automata (MQCA) device using solitons in a nanoscale magnetic material to apply spin waves generated by the magnetic material to transfer and process data.

A magnetic vortex has a clockwise (CW) or counterclockwise (CCW) curling magnetization around a vortex core perpendicular to a disk plane. When a signal is injected into the magnetic vortex, gyrotropic motion of the vortex core may be excited in a unique mode. When a plurality of magnetic thin film structures having the above-described vortex or skyrmion structure are arranged adjacent to each other, a coupled mode or coupled gyration mode thereof is present.

Owing to low energy consumption, low energy loss, high operation speed, and easy controllability, magnetic vortex or skyrmion structure is expected to be applicable to data processing such as communication devices, memory devices, and logic devices in the future.

SUMMARY

The present inventive concepts provide selective signal transferring and/or reliable signal transferring control in regard to existing technology using the vortex or skyrmion structure and/or with regard to applications to signal transferring in a coupled mode.

The present inventive concepts provide a signal transferring device and multiplexer using magnetic thin film structures having low energy consumption and easily-controllable wave characteristics.

The present inventive concepts also provide a signal transferring device using magnetic thin film structures capable of selectively and reliably transferring signals.

The present inventive concepts also provides a multiplexer using magnetic thin film structures capable of performing time-division multiplexing/demultiplexing and frequency-division multiplexing/demultiplexing.

However, the scope of the present inventive concepts is not limited thereto.

According to some example embodiments of the present inventive concepts, a signal transferring device may include a first structure that includes a first magnetic thin film structure having a first magnetic vortex configured to receive a signal as an input signal, a second structure that is spaced apart from at least one side of the first structure, the second structure including a second magnetic thin film structure having a second magnetic vortex configured to transfer the signal, and a third structure that is spaced apart from at least one side of the second structure, the third structure including a third magnetic thin film structure having a third magnetic vortex configured to output the signal from the signal transferring device. The first and third structures may have a symmetrical shape, and the second structure may have an asymmetrical shape.

According to some example embodiments of the present inventive concepts, a multiplexer may include a signal inputter at respective first ends of a plurality of paths; and a separate signal outputter at a second end of each path of the plurality of paths. A first structure that includes a first magnetic thin film structure may be on the signal inputter, At least one structure of second structures and third structures may be on each path extending to the separate signal outputter of the path. Each second structure of the second structures may include a separate second magnetic thin film structure. Each third structure of the third structures may include a separate third magnetic thin film structure. The first and third structures may each have a symmetrical shape and the second structure may have an asymmetrical shape.

The first and third structures may have a disk shape and the second structure may have a separate disk shape including at least one asymmetrical portion.

The separate disk shape may include at least one flat edge.

An asymmetrical portion of the second structure may face the third structure.

The first, second, and third structures may have equal in-plane curling magnetizations.

When the magnetic thin film structures are positioned on an xy plane, a vortex core of the first structure may exhibit three coupled modes when an in-plane magnetic bias field is applied in a y axis direction, and exhibit two coupled modes when an in-plane magnetic bias field is applied in a −y axis direction.

When the magnetic thin film structures are positioned on an xy plane, an input signal of the first structure may be transferred via the second structure to the third structure when an in-plane magnetic bias field is applied in a y axis direction, and not be transferred to the third structure when a magnetic field is applied in a −y axis direction.

Resonant frequencies of the first and third structures may increase when vortex cores are shifted outward from disk centers, and a resonant frequency of the second structure may decrease when a vortex core is shifted outward from a disk center.

BRIEF DESCRIPTION OF THE DRAWINGS

The above and other features and advantages of the present inventive concepts will become more apparent by describing in detail some example embodiments thereof with reference to the attached drawings in which.

DETAILED DESCRIPTION

Figure 1A:
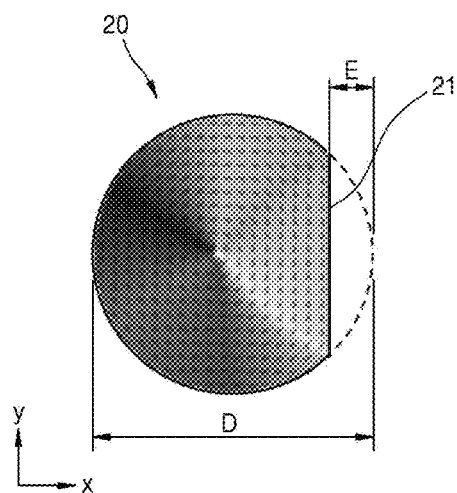
FIGS. 1A and 1B are schematic diagrams showing types of magnetic thin film structures according to some example embodiments of the present inventive concepts.

The following detailed descriptions of the inventive concepts will be made with reference to the accompanying drawings illustrating some example embodiments of the inventive concepts by way of example. Some example embodiments will be described in detail such that the inventive concepts can be carried out by one of ordinary skill in the art. It should be understood that various embodiments of the inventive concepts are different, but are not necessarily mutually exclusive. For example, a specific shape, structure, and characteristic of some example embodiments described herein may be implemented in some example embodiments without departing from the scope of the inventive concepts. In addition, it should be understood that a position or placement of each component in each example embodiment may be changed without departing from the scope of the inventive concepts. Accordingly, there is no intent to limit the inventive concepts to the following detailed descriptions. The scope of the inventive concepts is defined by the appended claims and encompasses all equivalents that fall within the scope of the appended claims. In the drawings, like reference numerals denote like functions, and the dimensions such as lengths, areas, and thicknesses of elements may be exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, to allow one of ordinary skill in the art to easily carry out the inventive concepts, embodiments of the present inventive concepts will be described in detail with reference to the accompanying drawings.

Figure 1B:
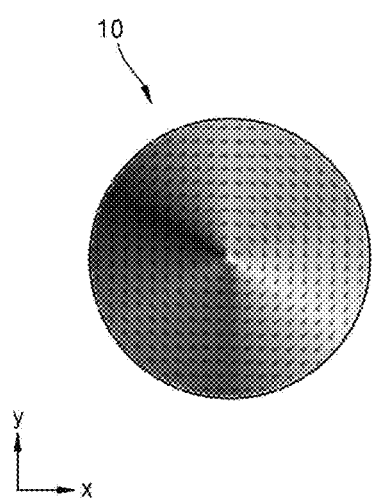

FIGS. 1A and 1B are schematic diagrams showing types of magnetic thin film structures according to some example embodiments of the present inventive concepts.

Referring to FIGS. 1A and 1B, in the present inventive concepts, the magnetic thin film structures used to implement a signal transferring device may include two types. The magnetic thin film structures may include two types such as a first structure 10 having a disk shape as illustrated in FIG. 1B, and a second structure 20 obtained by modifying the symmetrical first structure 10 to include an asymmetrical portion or at least one flat edge 21 as illustrated in FIG. 1A. In the present inventive concepts, a disk-type structure including at least one flat edge will be described as an example of a structure including an asymmetrical portion. However, the shape of the second structure 20 is not limited thereto. Any disk shape having an off-centered core, e.g., a disk shape including at least one portion having a curvature different from that of the other portion or a disk shape including a plurality of edges, may be included in the asymmetrical structure, and even a polygonal shape including an asymmetrical portion may also be included in the asymmetrical structure. A third structure 30 to be described below may have the same shape or substantially the same shape as the first structure 10. In the following description, the first structure 10 is also referred to as a 'circular disk' and the second structure 20 is also referred to as a 'chopped disk'.

The magnetic thin film structures may be formed using a thin film deposition method such as sputtering, electron beam evaporation, or thermal evaporation. The second structure 20 may be formed by a same method used for the first structure 10 and an additional patterning process to include an asymmetrical portion or at least one flat edge 21.

The magnetic thin film structures may be made of a ferromagnetic material, e.g., cobalt (Co), iron (Fe), nickel (Ni), Fe—Ni alloy, Fe—Ni—Co alloy, or Fe—Ni-molybdenum (Mo) alloy.

A magnetization structure in a ferromagnetic thin film is determined depending on the shape, thickness, diameter, etc. Particularly, in a cylindrical magnetic film with a diameter of several to several hundred micrometers and a thickness of several ten nanometers, there may exist a magnetic vortex structure at least partially comprising (e.g., consisting of) a core magnetized perpendicularly to a disk plane with a diameter of about 10 nm in a disk center and a clockwise (CW)/counterclockwise (CCW) curling in-plane magnetization around the core. A magnetic vortex is can be classified into four types according to its polarity of a core and chirality of a curling magnetization. The vortex has very high thermal and energetic stability.

According to some example embodiments, the first and second structures 10 and 20 made of permalloy (Py: Ni81Fe19) may commonly have a diameter D of 1,000 nm and a thickness of 40 nm and the second structure 20 may have a chopped width E of 150 nm.

Figure 2:
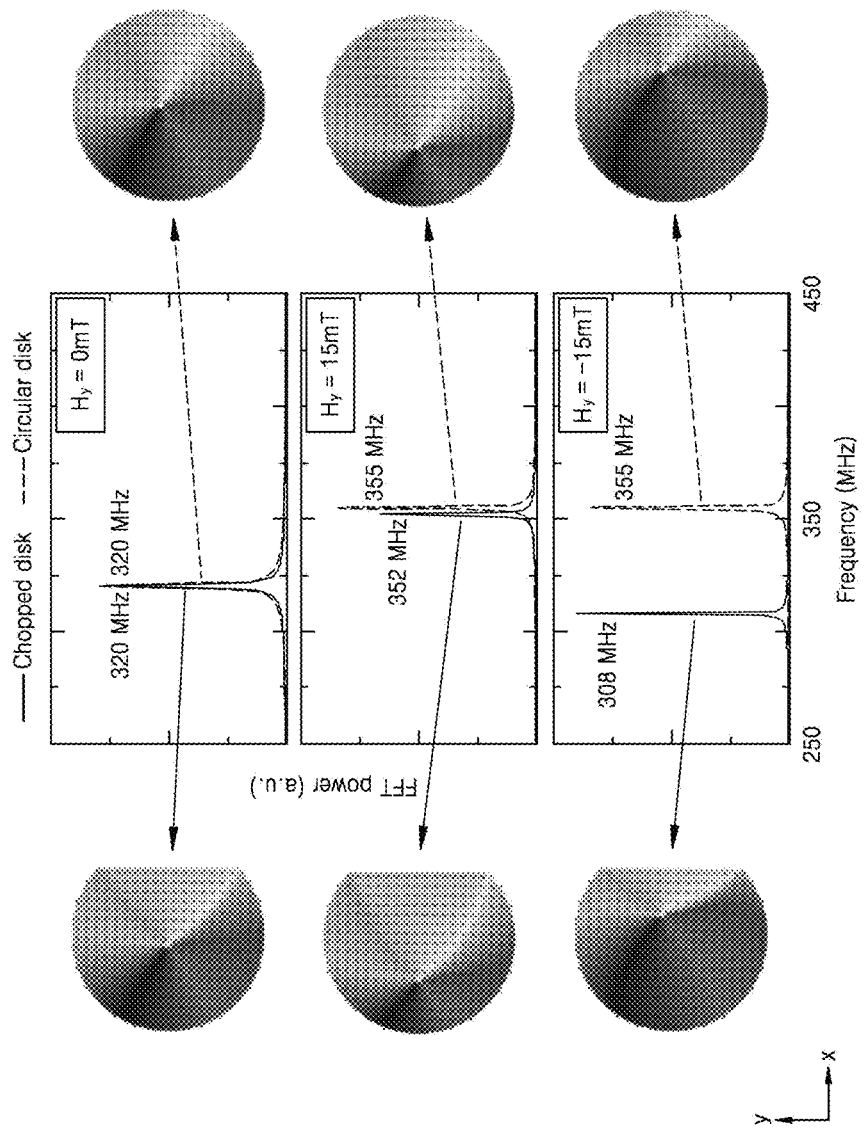
FIG. 2 includes graphs showing fast Fourier transformation (FFT) power of magnetic thin film structures according to some example embodiments of the present inventive concepts, depending on a bias field.
Figure 3A:
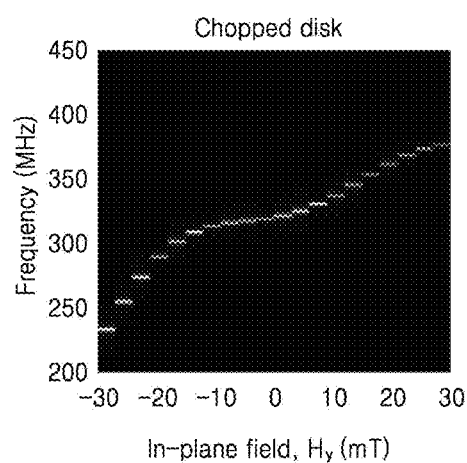
FIGS. 3A and 3B include graphs showing variations in gyrotropic resonant frequencies of magnetic thin film structures according to some example embodiments of the present inventive concepts, depending on the intensity of an in-plane magnetic bias field.
Figure 3B:
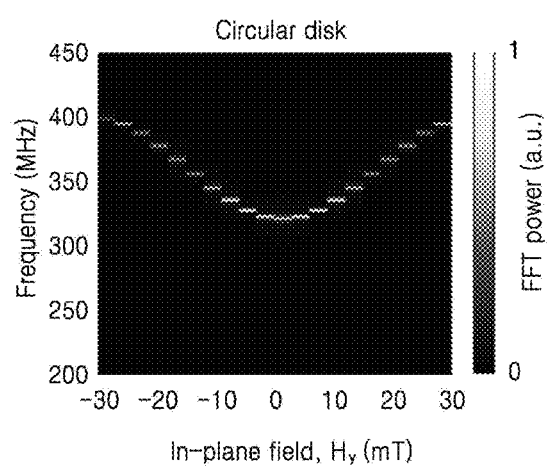

FIG. 2 includes graphs showing fast Fourier transformation (FFT) power of magnetic thin film structures according to some example embodiments of the present inventive concepts, depending on a bias field. The graphs show resonant modes of the magnetic thin film structures depending on the bias field. FIGS. 3A and 3B include graphs showing variations in gyrotropic resonant frequencies of magnetic thin film structures according to some example embodiments of the present inventive concepts, depending on the intensity of an in-plane magnetic bias field.

To measure individual magnetizations in the vortex configurations of the first and second structures 10 and 20, micromagnetic simulation code using the Landau-Lifshitz-Gilbert (LLG) equation, e.g., oommf or mumax3, may be used or the equation may be directly solved.

$$\partial M/\partial t = -\gamma M \times H_{eff} + (\alpha/M_s) M \times \partial M/\partial t,$$

where $H_{eff}$ is a total effective field, $M_s$ is a saturation magnetization, and $\alpha$ is a Gilbert damping constant As Py material parameters, the saturation magnetization $M_s$ is $8.0 \times 10^5$ A/m, an exchange stiffness constant $A_{ex}$ is $1.3 \times 10^{-11}$ J/m, the Gilbert damping constant $\alpha$ is 0.01, a gyromagnetic ratio $\gamma$ is $2.21 \times 10^5$ m/A·s, and magnetocrystalline anisotropy is 0. A cell size is $5 \times 5 \times 40$ nm$^3$.

Without an external magnetic field, a vortex is energetically stable when a core is placed in a center of the disk. However, when a specific external magnetic field or current is applied, the vortex is off-centered and gyrates. In this case, the vortex core gyrates with a specific eigenfrequency depending on the type and material of the magnetic thin film structure. Therefore, even a low-intensity of an external sinusoidal magnetic field with a resonant frequency can excite a strong gyrotropic motion of a vortex core due to the resonance phenomenon.

In the present inventive concepts, a gyrotropic motion of the vortex core as an input signal from outside may be induced by displacing a vortex core from a center. Herein, the center refers to a position at which the vortex core is in a stable state without being influenced by an external magnetic field.

The vortex core of the magnetic thin film structure may be displaced from the center by applying a magnetic field or current to the magnetic thin film structure. Herein, a method of directly applying a magnetic field to the magnetic thin film structure includes, for example, a method of applying a linear magnetic field. A linear magnetic field may be generated by positioning wire on or under the magnetic thin film structure in parallel with the longitude direction of the structure and application of current to the wire.

Referring to FIGS. 2 and 3, two types of magnetic thin film structures, e.g., the first structure 10 (e.g., a circular disk) having a diameter D of 1,000 nm and a thickness of 40 nm and the second structure 20 (e.g., a chopped disk) having a chopped width E of 150 nm, are compared. A vortex of each of the first and second structures 10 and 20 is assumed as having an upward core and a counterclockwise (CCW) curling in-plane magnetization. A resonant frequency depending on a linear magnetic field $H_y$ is identified.

When $H_y=0$ mT and when $H_y=15$ mT, the chopped disk and the circular disk exhibit similar resonant frequencies because the gyrotropic motion each vortex core motion is similar due to the resemblance between a left portion of the chopped disk and that of the circular disk.

On the other hand, when $H_y=-15$ mT, the difference between resonant frequencies of the chopped disk and the circular disk is clearly exhibited.

Particularly, as shown in FIGS. 3A and 3B, the resonant frequency of the circular disk increases in proportion to the intensity of the magnetic field as the core is shifted away from the disk center regardless of the direction of the magnetic field, but the resonant frequency of the chopped disk decreases in inverse proportion to the intensity of the magnetic field when the magnetic field is applied in a direction in which the core approaches the flat edge, because dynamic stiffness of the vortex decreases as the core approaches the flat edge. For example, referring to a signal transferring device including the first, second, and third structures 10, 20, and 30 for example as shown in FIGS. 4A to 4C, where the first and third structures 10 and 30 have a circular disk shape and the second structure 20 has a chopped disk shape, the signal transferring device may be configured to cause resonant frequencies of the first and third structures 10 and 30 to increase in response to respective vortex cores of the first and third structures 10 and 30 being shifted outward from respective disk centers of the first and third structures 10 and 30, and the signal transferring device may be further configured to cause a resonant frequency of the second structure 20 to decrease in response to a vortex core of the second structure 20 being shifted outward from a disk center of the second structure 20.

A signal transferring device of the present inventive concepts, which is designed by applying the principle described above in relation to FIGS. 1A to 3B, will now be described.

Figure 4A:
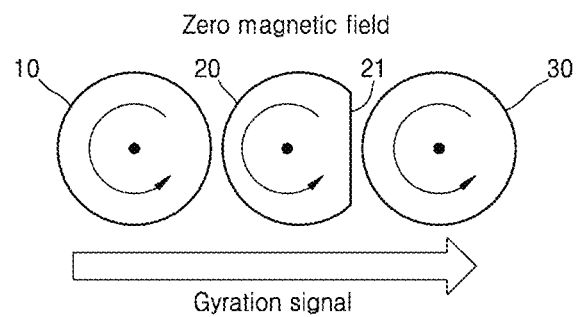
FIGS. 4A, 4B, and 4C are schematic diagrams showing operation of a signal transferring device according to some example embodiments of the present inventive concepts.
Figure 4B:
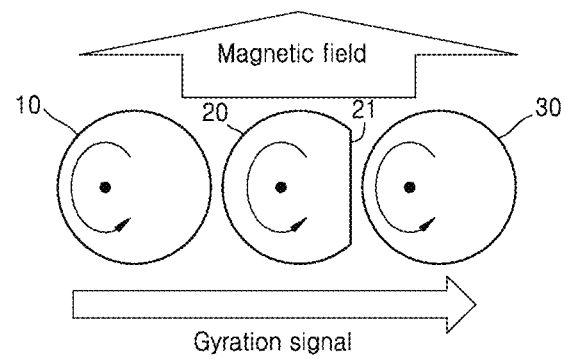
Figure 4C:
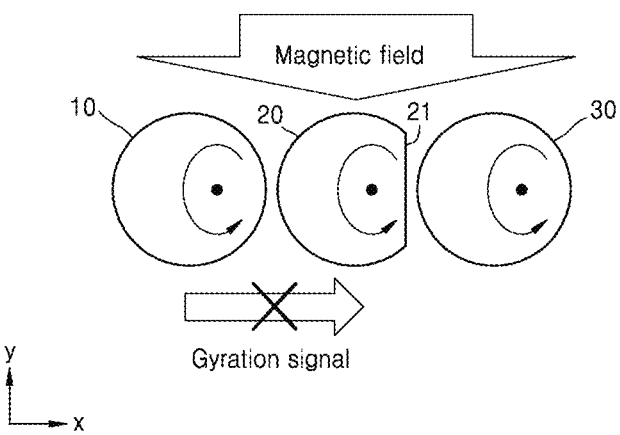

FIGS. 4A, 4B, and 4C are schematic diagram showing operation of a signal transferring device according to some example embodiments of the present inventive concepts.

Referring to FIGS. 4A to 4C, the signal transferring device of the present inventive concepts may include the first structure 10, the second structure 20, and the third structure 30 positioned to be spaced apart from each other. For example, as shown in FIGS. 4A to 4C, the second structure 20 may be spaced apart from at least one side of the first structure 10, and the third structure 30 may be spaced apart from at least one side of the second structure 20. The first and third structures 10 and 30 may have a symmetrical shape which may be a same shape or substantially a same shape, and the second structure 20 may have an asymmetrical shape. For example, the first and third structures 10 and 30 may have a disk shape, for example the same circular disk shape or substantially the same circular disk shape, and the second structure 20 may have a disk shape comprising at least one asymmetrical portion, for example a disk shape comprising at least one flat edge, for example a chopped disk shape including the flat edge 21 as shown in FIGS. 4A-4C.

As shown in FIGS. 4A-4C, and with further references to the first, second, and third structures 10, 20, and 30 according to any of the example embodiments as described herein, the first structure 10 may be understood to include a first magnetic thin film structure having a first magnetic vortex, the second structure 20 may be understood to include a second magnetic thin film structure having a second magnetic vortex, and the third structure 30 may be understood to include a third magnetic thin film structure having a third magnetic vortex. Where the first, second, and third structures 10, 20, and 30 are included in a signal transferring device, the first magnetic thin film structure of the first structure 10, having a first magnetic vortex, may be configured to receive a signal (e.g., an input signal into the signal transferring device), the second magnetic thin film structure of the second structure 20, having a second magnetic vortex, may be configured to transfer a signal (e.g., transfer the signal received at an input signal into at the first structure 10), and the third magnetic thin film structure of the third structure 30, having a third magnetic vortex, may be configured to output a signal (e.g., output the signal transferred by the second structure 20 as an output signal that is output by the signal transferring device).

The signal transferring device of the present inventive concepts is characterized in that a signal is input to the first structure 10 and a signal output from the third structure 30 is controlled according to the core motion of the second structure 20.

Although FIGS. 4A to 4C illustrate the simplest example of signal transferring device comprising the first, second, and third structures 10, 20, and 30, a signal transferring device including any combination of shape, structure, size, etc. of the first, second, and third structures 10, 20, and 30 may be implemented, as long as at least one second structure 20. In addition, the magnetic thin film structures may be arranged in a straight or curved line, in a two-dimensional planar structure, or in a three-dimensional shape.

Gyrotropic motion of a vortex core of the first structure 10 may cause gyrotropic motion of a core of the second structure 20, and the gyrotropic motion of the core of the second structure 20 may cause gyrotropic motion of a core of the third structure 30, thereby the signal of gyrotropic motion in the first structure 10 is transferred to the third structure 30 through the second structure 20. When a signal is input to the magnetic thin film structure, gyrotropic motion of a vortex core may occur then it may cause gyrotropic motion of a vortex core in a neighboring magnetic thin film structure and thus the signal may be transferred.

Interaction between neighboring vortices is caused by dipole-dipole interaction between the vortices. A shift of a vortex core from a disk center in a magnetic thin film structure induces effective magnetization inside the magnetic thin film structure and a stray field around it. The stray field interacts to the neighboring magnetic structure, resulting the changes in the magnetization and the energy state of a neighboring magnetic structure.

Due to gyration of the vortex core, the stray field also rotates at the same frequency of the vortex core but in an opposite direction of core gyration. In this case, the gyrating stray field interacts with a vortex core in another neighboring disk-type magnetic thin film structure and causes gyrotropic motion of the vortex core in the neighboring magnetic thin film structure. Therefore, when gyrotropic motion of a vortex core is excited by using an external magnetic field or current, vortex cores in neighboring disk are affected by the stray field and their positions are sequentially shifted by the dipole-dipole interaction, thereby the initial gyrotropic motion of vortex core is propagated to neighboring vortex cores.

Herein, a high-amplitude signal may be generated at low input power by using resonance of a unique mode of the vortex. That is, by forming a magnetic field having a frequency equal to an eigenfrequency of a vortex core in a magnetic thin film structure and applying it to the magnetic thin film structure, a high-amplitude signal of core gyration can be obtained using the resonance phenomenon even with a small amount of energy.

Referring to FIG. 4A, when a magnetic field $H_y$ is 0 mT, because the first and second structures 10 and 20 have equal resonant frequencies (see FIG. 2), a gyration signal may be easily transferred from the first structure 10 to the second structure 20, and be also easily transferred again from the second structure 20 to the third structure 30.

Referring to FIG. 4B, when the magnetic field $H_y$ is applied in the +y direction, a gyration signal may be easily transferred from the first structure 10 to the second structure 20, and be transferred again from the second structure 20 to the third structure 30 because the first, second, and third structures 10, 20, and 30 have almost equal resonant frequencies (see FIG. 2).

However, referring to FIG. 4C, when the magnetic field $H_y$ is applied in the −y direction, a gyration signal may not be transferred from the first structure 10 to the second structure 20, and transferring of the signal from the second structure 20 to the third structure 30 is also suppressed because the resonant frequencies of the first and third structures 10 and 30 are different from that of the second structure 20 (see FIG. 2). To make the resonant frequencies of the first and second structures 10 and 20 different, the flat edge 21 of the second structure 20 may be positioned to face the third structure 30, for example as shown in FIGS. 4A-4C. Restated, and as shown in FIGS. 4A-4C, the asymmetrical portion of the second structure 20 (e.g., the flat edge 21) may face the third structure 30, for example such that the flat edge 21 is a proximate edge of the second structure 20 in relation to the third structure 30.

The signal transferring device of the present inventive concepts may control signal transferring depending on the resonant frequencies of the first and second structures 10 and 20 by using the difference between FIGS. 4A, 4B, and 4C. For example, referring to the first, second, and third structures 10, 20, and 30 as described herein and as shown in FIGS. 4A to 4C, the respective first, second, and third magnetic thin film structures of the first, second, and third structures 10, 20, and 30 (e.g., of a signal transferring device) may be located on an xy plane such that the xy plane, and the signal transferring device that includes the first, second, and third structures 10, 20, and 30 may be configured to cause an input signal received at the first structure 10 to be transferred via the second structure 20 to the third structure 30 in response to a magnetic field being applied to the first, second, and third magnetic thin film structures in a +y axis direction in relation to the xy plane (e.g., in response to $H_y$>0 mT), and to cause the input signal received at the first structure 10 to not be transferred to the third structure 30 (e.g., not to be transferred from the first structure 10 to the third structure 30 via the second structure 20) in response to a magnetic field being applied to the first, second, and third magnetic thin film structures in a −y axis direction in relation to the xy plane (e.g., in response to $H_y$<0 mT).

Figure 5:
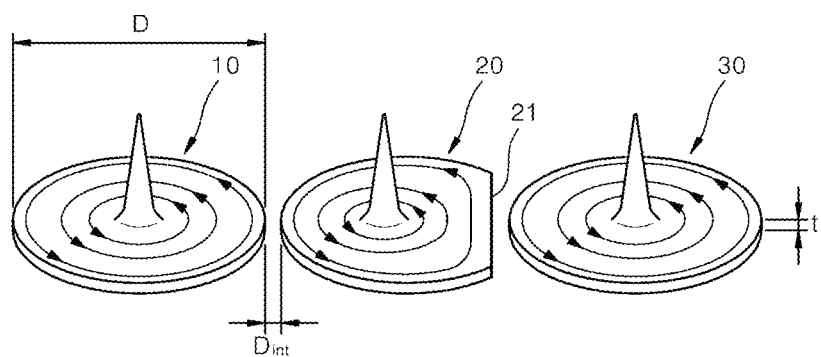
FIG. 5 is a schematic diagram of signal transferring devices according to some example embodiments of the present inventive concepts and a comparative example.
Figure 5:
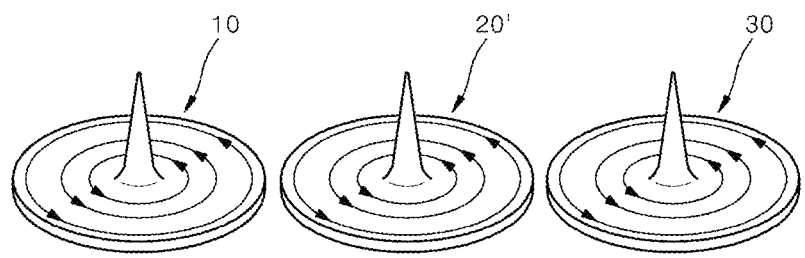

FIG. 5 is a schematic diagram of signal transferring devices according to some example embodiments of the present inventive concepts and a comparative example.

In some example embodiments, three permalloy (Py: $Ni_{81}Fe_{19}$) magnetic thin film structures having a diameter D of 1,000 nm, a thickness t of 40 nm, and a disk interval $D_{int}$ of 100 nm are used.

The signal transferring device according to some example embodiments of the present inventive concepts may be obtained by positioning the first structure 10, the second structure 20, and the third structure 30 as illustrated in an upper part of FIG. 5, wherein the second structure 20 has a chopped disk shape, and be referred to as "Type I".

The signal transferring device according to the comparative example may be obtained by positioning the first structure 10, a second structure 20', and the third structure 30 as illustrated in a lower part of FIG. 5, wherein the second structure 20' has the same circular disk shape as the first and third structures 10 and 30, and be referred to as "Type II".

It is assumed that the magnetic thin film structures of both Type I and Type II have upward core magnetizations and CCW curling in-plane magnetizations.

Figure 6:
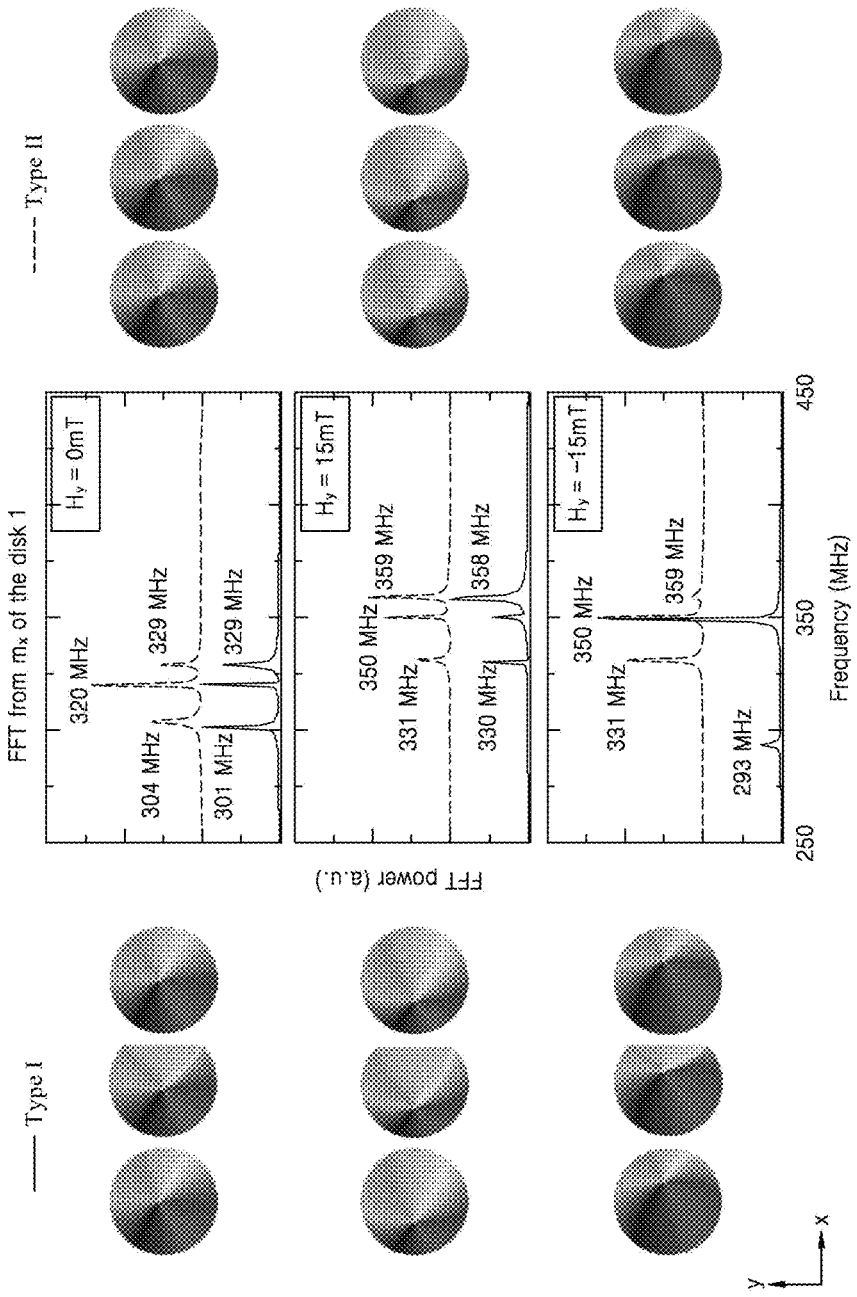
FIG. 6 includes graphs showing FFT power of signal transferring devices according to some example embodiments of the present inventive concepts and a comparative example, depending on a bias field.

FIG. 6 includes graphs showing FFT power of the signal transferring devices according to some example embodiments of the present inventive concepts and the comparative example, depending on a bias field. The graphs show coupled modes depending on the bias field.

To check all coupled modes available in Type I and Type II, an initial disk-centered core is shifted in a +y direction by applying a static magnetic field to the first structure 10 in a +x direction. After releasing the magnetic field, the core position of each structure is monitored and its FFT analysis is performed.

When $H_y$=0 mT, both Type I and Type II exhibit three coupled modes.

When $H_y$=15 mT, both Type I and Type II also exhibit three coupled modes at higher frequencies compared to 0 mT. All mode frequencies increase in proportion to the intensity of the in-plane magnetic bias field. The difference between peak positions hardly changes.

On the other hand, when $H_y$=−15 mT, Type II exhibits three coupled modes but Type I exhibits only two modes. One of the two modes has much lower intensity than the other. This means that the coupling between the first and second structures 10 and 20 as well as between the second and third structures 20 and 30 is very weak due to the difference in the resonant frequency.

For example, referring to the first, second, and third structures 10, 20, and 30 as described herein and as shown in FIG. 6 (type I), the respective first, second, and third magnetic thin film structures of the first, second, and third structures 10, 20, and 30 (e.g., of a signal transferring device) may be located on an xy plane such that the xy plane intersects each of the first, second, and third magnetic thin film structures, and the signal transferring device that includes the first, second, and third structures 10, 20, and 30 may be configured to cause a vortex core of the first structure 10 to exhibit three coupled modes in response to a magnetic field being applied to the first, second, and third magnetic thin film structures in a y axis direction (also referred to herein as a +y axis direction) in relation to the xy plane (e.g., in response to $H_y=15$ mT) and exhibit two coupled modes in response to a magnetic field being applied to the first, second, and third magnetic thin film structures in a −y axis direction in relation to the xy plane (e.g., in response to $H_y=-15$ mT).

For example, referring to the first, second, and third structures 10, 20, and 30 as described herein and as shown in FIG. 6 (type I), the signal transferring device may be configured to cause resonant frequencies of the first and third structures 10 and 30 to increase in response to respective vortex cores of the first and third structures 10 and 30 being shifted outward from respective disk centers of the first and third structures 10 and 30, and the signal transferring device may be further configured to cause a resonant frequency of the second structure 20 to decrease in response to a vortex core of the second structure 20 being shifted outward from a disk center of the second structure 20.

Figure 7:
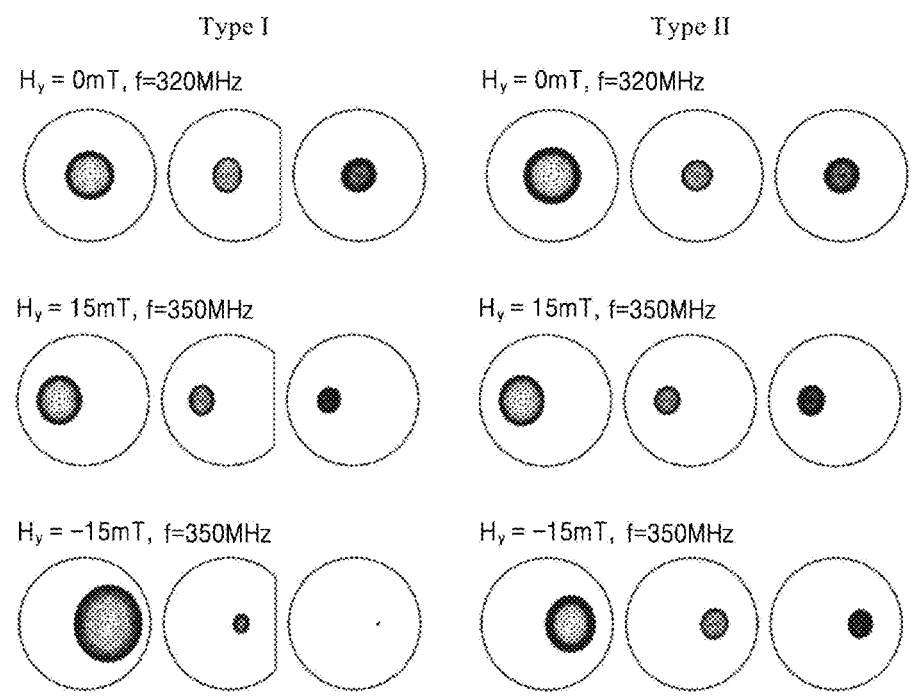
FIG. 7 is a schematic diagram showing orbits of cores of signal transferring devices according to some example embodiments of the present inventive concepts and a comparative example, depending on a bias field.

FIG. 7 is a schematic diagram showing orbits of cores of the signal transferring devices according to some example embodiments of the present inventive concepts and the comparative example, depending on a bias field. The orbits are enlarged five times for convenience of explanation.

Gyration signal propagation in Type I and Type II will now be described depending on the orbits of the cores. A gyration signal is excited by applying a sinusoidal field of 0.2 mT only to the first structure on the left side. A sinusoidal field of f=320 MHz is used for $H_y=0$ mT and a sinusoidal field of f=350 MHz is used for $H_y=\pm15$ mT.

Referring to FIG. 7, in Type II, the gyration signal always propagates to the first, second, and third structures 10, 20', and 30 when $H_y=0$ mT and when $H_y=\pm15$ mT.

On the other hand, in Type I, the gyration signal propagates to the first, second, and third structures 10, 20, and 30 when $H_y=0$ mT and when $H_y=+15$ mT, but is hindered by the second structure 20 when $H_y=-15$ mT. When $H_y=-15$ mT, because the core of the second structure 20 is shifted toward the flat edge, signal transferring to the third structure 30 is hindered due to the difference in resonant frequency.

Figure 8:
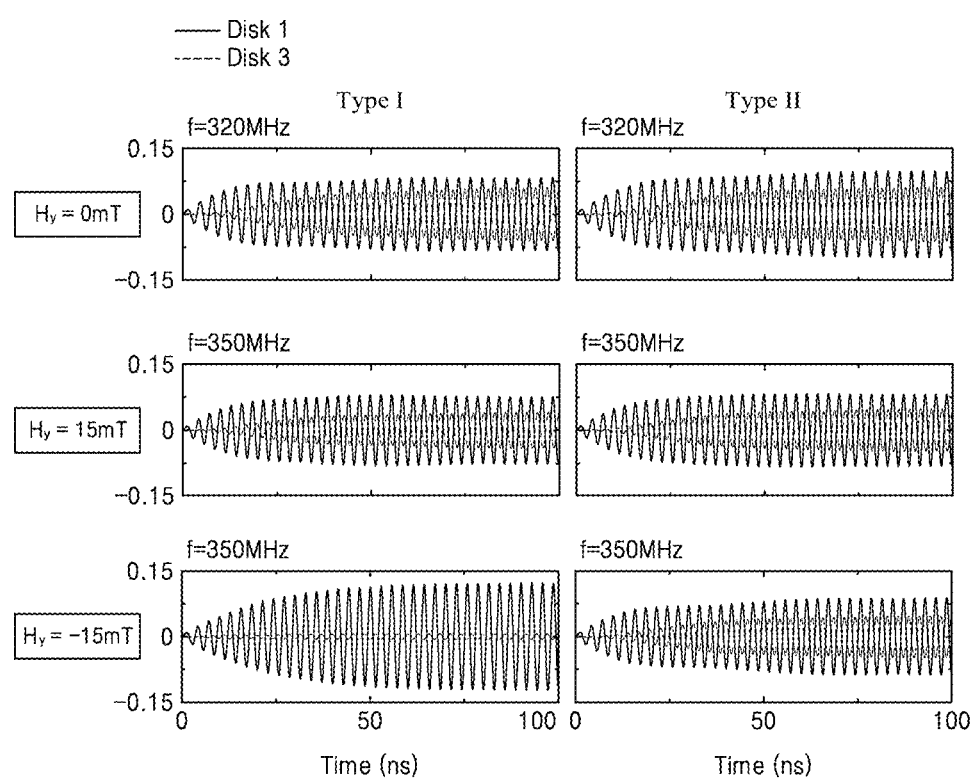
FIG. 8 includes graphs showing the amplitudes of gyration signals of first and third structures of signal transferring devices according to some example embodiments of the present inventive concepts and a comparative example.

FIG. 8 includes graphs showing the amplitudes of gyration signals of the first and third structures 10 and 30 of the signal transferring devices according to some example embodiments of the present inventive concepts and the comparative example. The amplitudes of the gyration signals are compared depending on variations in x-direction magnetization (the y axis of the graph) according to time (the x axis of the graph).

Referring to FIG. 8, similarly to FIG. 7, Type I shows that the gyration signal does not propagate to the third structure 30 (see "Disk 3") only when $H_y=-15$ mT.

Figure 9:
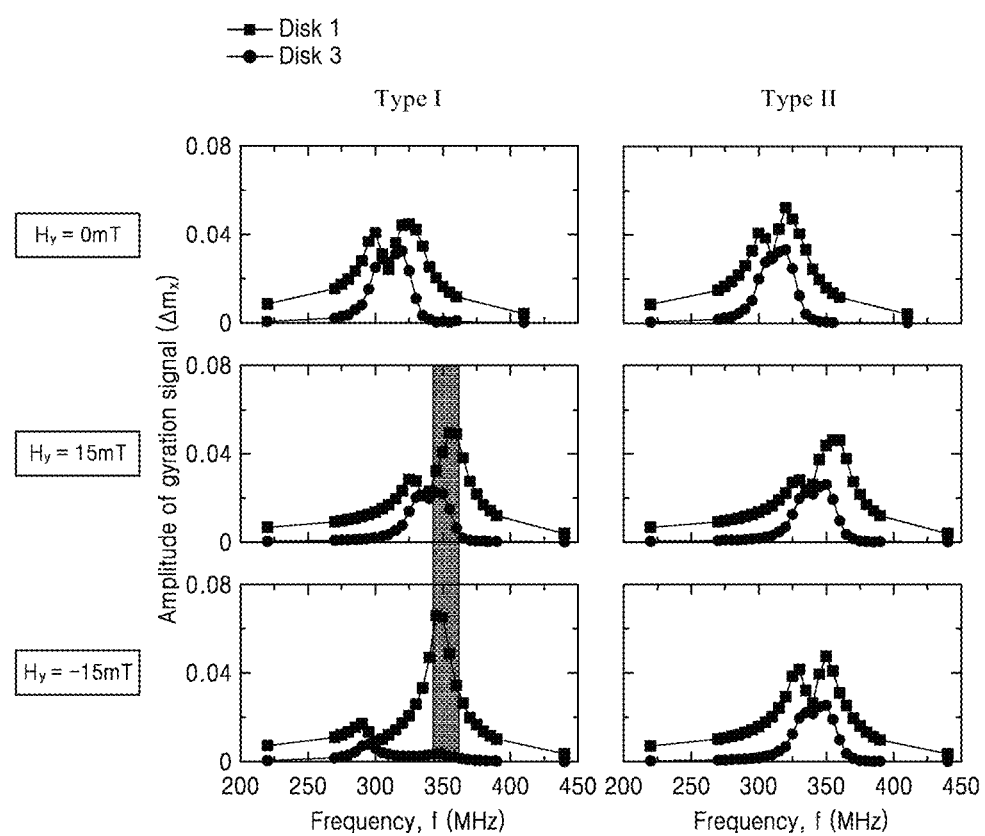
FIG. 9 includes graphs showing the amplitudes of gyration signals of first and third structures of signal transferring devices according to some example embodiments of the present inventive concepts and a comparative example, depending on a frequency.

FIG. 9 includes graphs showing the amplitudes of gyration signals of the first and third structures 10 and 30 of the signal transferring devices according to some example embodiments of the present inventive concepts and the comparative example, depending on a frequency.

Referring to FIG. 9, it is shown that the amplitude of the gyration signal depends on the frequency of a sinusoidal field. Both Type I and Type II show that the gyration signal of the first structure 10 (see "Disk 1") exhibits a peak near a coupled mode frequency under the corresponding bias field. It is shown that the gyration signal propagates well near a specific frequency in most cases.

When $H_y=-15$ mT is applied to Type I, it is shown that the gyration signal is hardly transferred near f=350 MHz, and a small signal near f=290 MHz is a resonant frequency of the second structure 20 (see "Disk 2") for $H_y=-15$ mT. On the other hand, when $H_y=+15$ mT is applied to Type I, it is shown that the gyration signal propagates well in a range of 330 MHz<f<350 MHz.

Implementation of a time-division and frequency-division multiplexer/demultiplexer depending on an array of circular and chopped disks is proposed by applying the above-described signal transferring device and signal transferring principle.

Figures 10A, 10B:
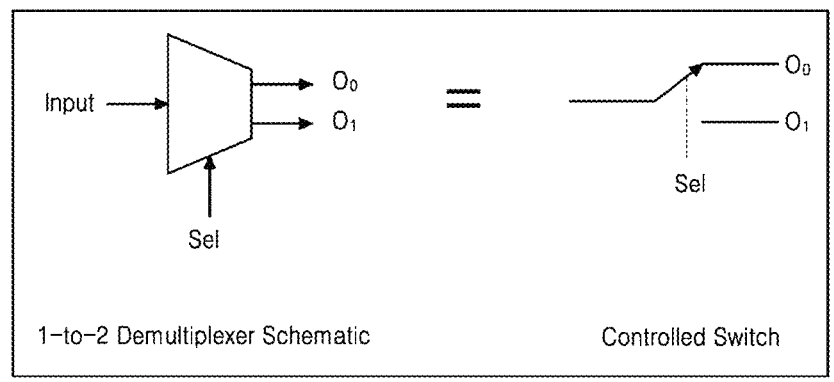
FIGS. 10A and 10B include a schematic diagram and a truth table of a demultiplexer.

FIGS. 10A and 10B include a schematic diagram and a truth table of a demultiplexer.

As the simplest demultiplexer, FIGS. 10A and 10B illustrate a simple model for receiving one input signal Input and selecting one of two output signals Output 1 and Output 2. The output signal Output 1 or Output 2 may have a value 0 or 1 by controlling the input signal Input and a select line.

Figure 11A:
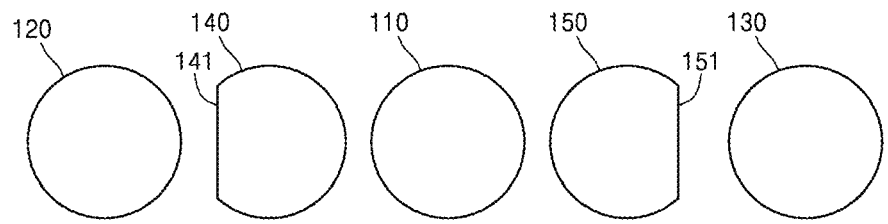
FIGS. 11A, 11B, and 11C are schematic diagrams showing operation of a multiplexer/demultiplexer according to some example embodiments of the present inventive concepts.
Figure 11B:
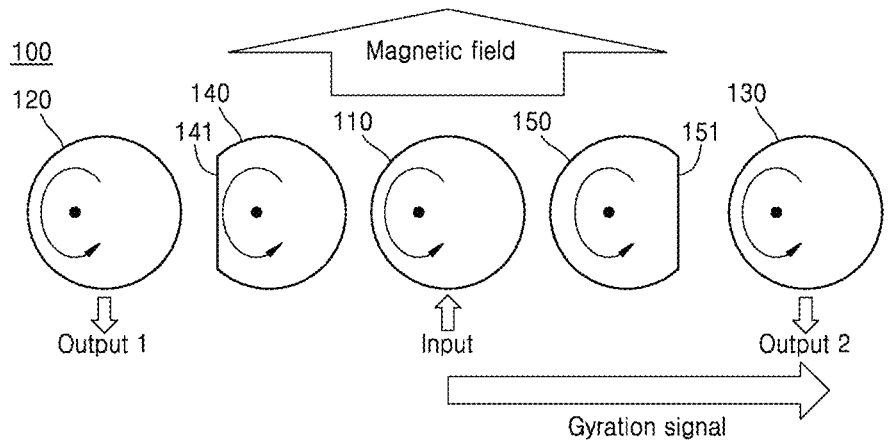
Figure 11C:
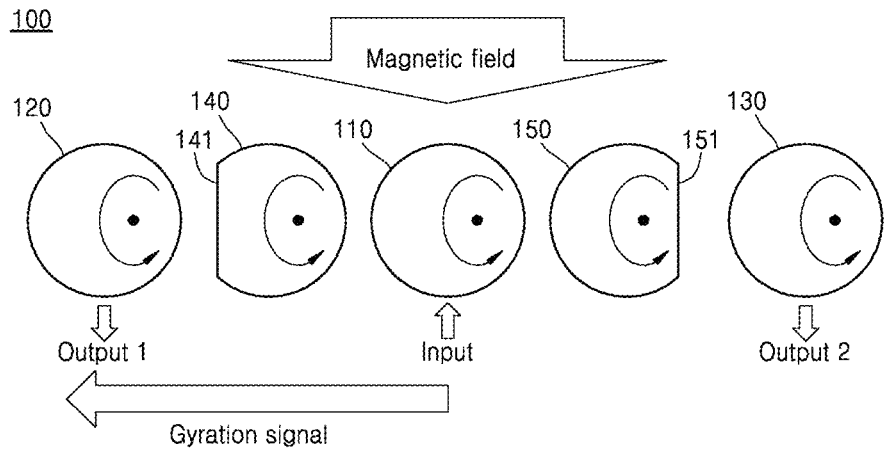

FIGS. 11A, 11B, and 11C are schematic diagrams showing operation of a multiplexer/demultiplexer 100 according to some example embodiments of the present inventive concepts. The following description is focused, as an example, on a demultiplexer for dividing a signal in a signal reception step, but is also applicable to a multiplexer for selecting a signal in a signal transmission step. Accordingly, it will be understood that a "multiplexer," "demultiplexer," and/or "multiplexer/demultiplexer" as described herein with regard to some example embodiments may, in some example embodiments, be a "multiplexer," a "demultiplexer," and/or a "multiplexer/demultiplexer."

Referring to FIG. 11A, an array of magnetic thin film structures for implementing a basic form of the demultiplexer 100 as illustrated in FIG. 10 is proposed. Herein, a first structure 110 may be configured the same or substantially the same as the first structure 10, and third structures 120 and 130 may be configured the same or substantially the same as the first structure 110. Second structures 140 and 150 having flat edges 141 and 151 may be configured the same or substantially the same as the second structure 20.

The first structure 110 may be used as a signal inputter of the demultiplexer 100. The second and third structures 120, 130, 140, and 150 may be positioned along a plurality of paths from the first structure 110, and signal outputters may be positioned at the ends of the paths. Accordingly, it will be understood that a signal inputter may be positioned at respective ends (e.g., respective first ends) of a plurality of paths, and the first structure 110 (which may include a first magnetic thin film structure as described herein according to any example embodiments) may be on the signal inputter. Depending on the paths, the third structures 120 and 130 or the second structures 140 and 150 may be used as the signal outputters (e.g., may be configured to cause signals to be output from the demultiplexer). Accordingly, it will be understood that a separate signal outputter may be positioned at a second end of each path of the plurality of paths, where the second end is opposite from the first end of the path (at which the signal inputter is positioned), and at least one structure of the third structures 120 and 130 and/or the second structures 140 and 150 may be on each path extending to at least one separate signal outputter, such that (as shown in FIGS. 11A-11C) the separate paths to separate signal outputters at separate, respective (e.g., different) second ends may include separate, respective (e.g., different) structures of the third structures 120 and 130 and/or the second structures 140 and 150. A described herein, a structure being on a given path may be interchangeably referred to as the given path "including" the structure. For example, as shown in FIGS. 11A to 11C, each separate path from the first end thereof (at which the first structure 110 is positioned) may include at least one second structure of the second structures 140 and 150 and at least one third structure of the third structures 120 and 130. However, example embodiments are not limited thereto. For example, in some example embodiments at least one path may include a plurality of second structures and no third structures. In another example, in some example embodiments at least one path may include a plurality of second structures and at least one third structure. In another example, in some example embodiments at least one path may include a plurality of third structures and no second structures. In another example, in some example embodiments at least one path may include a plurality of third structures and at least one second structure. The second structures 140 and 150 may include respective second magnetic thin film structures as described herein according to any example embodiments, and the third structures 120 and 130 may include respective third magnetic thin film structures as described herein according to any example embodiments. The number (e.g., quantity) of third structures 120 and 130 or second structures 140 and 150 may vary. As shown in FIGS. 11A to 11C, the first and third structures 110, 120, and 130 may each have a symmetrical shape (e.g., a same circular disk shape as shown), and the second structures 140 and 150 may have an asymmetrical shape (e.g., a same chopped disk shape as shown). For example, the first and third structures 110, 120, and 130 may each have a disk shape (e.g., a same disk shape) and the second structures may have (e.g., may each have) a disk shape comprising at least one asymmetrical portion (e.g., a disk shape comprising at least one flat edge). As shown in FIGS. 11A to 11C, for each path of the paths extending from the first end at which the first structure 110 is positioned, one second structure (e.g., second structure 140 or second structure 150) and one third structure (e.g., third structure 120 or third structure 130) may be spaced apart from each other on the path, and the one third structure (e.g., third structure 120 or third structure 130) may be on the signal outputter of the respective path.

In the present inventive concepts, a case in which two paths are formed from both sides of the first structure 110 (e.g., the signal inputter) and the second and third structures 140 and 120, or 150 and 130 are sequentially positioned along each path will be described as an example. The two paths are connected in a straight line to face each other, and the third structures 120 and 130 positioned at the ends of the paths may be used as the signal outputters. The flat edges 141 and 151 of the second structures 140 and 150 may be positioned to face the third structures 120 and 130, such that, in each path, an asymmetrical portion of one second structure therein (e.g., flat edge 141 of second structure 140) may face one third structure therein (e.g., third structure 120). An electrode may be connected along each path to form a magnetic field or current flow. As shown in FIGS. 11A to 11C, a plurality of paths may include two paths that are connected in a straight line to face each other (e.g., extend along a common axis in opposite directions), where the two paths including a first path and a second path, the first structure 110 may be positioned between the first path and the second path, a first set of second and third structures (e.g., 120 and 140) may be sequentially spaced apart from each other along the first path from the first structure 110, and a second set of second and third structures (e.g., 150 and 130) may be sequentially spaced apart from each other along the second path from the first structure 110.

Referring to FIG. 11B, when $H_y>0$ mT, cores of all magnetic thin film structures may gyrate while being shifted leftward from disk centers. Herein, when a signal is input to the first structure 110, a gyration signal may be transferred from the first structure 110 to the second structure 150 along a second path (e.g., a rightward direction), and be transferred again from the second structure 150 to the third structure 130. This principle is the same as that described above in relation to FIG. 4B. Accordingly, and as shown in FIG. 11B, the first, second, and third magnetic thin film structures of the first to third structures 110, 120, 130, 140, and 150, for example of a demultiplexer 100 as shown, may be located on an xy plane such that the xy plane intersects each of the first, second, and third magnetic thin film structures, and the demultiplexer 100 may be configured to cause an input signal received at the first structure 110 to be transferred via a second structure of the second path (e.g., second structure 150) to a third structure of the second path (e.g., third structure 130), along the second path, in response to a magnetic field being applied to the first, second, and third magnetic thin film structures in a +y axis direction in relation to the xy plane.

On the other hand, a gyration signal may not be transferred from the first structure 110 to the second structure 140 along a first path (e.g., a leftward direction), and transferring of the signal from the second structure 140 to the third structure 120 is also suppressed. This principle is the same as that described above in relation to FIG. 4C. Accordingly, and as shown in FIG. 11C, the first, second, and third magnetic thin film structures of the first to third structures 110, 120, 130, 140, and 150, e.g., of the demultiplexer 100, may be located on an xy plane such that the xy plane intersects each of the first, second, and third magnetic thin film structures, the demultiplexer 100 may be configured to cause the input signal received at the first structure 110 to be transferred via a second structure of the first path (e.g., second structure 140) to a third structure of the first path (e.g., third structure 120), along the first path, in response to a magnetic field being applied to the first, second, and third magnetic thin film structures in a −y axis direction in relation to the xy plane.

Therefore, the input signal Input of the first structure 110 is output from the third structure 130 as the output signal Output 2 and is not output from the third structure 120 as the output signal Output 1.

Referring to (FIG. 11C, when $H_y<0$ mT, cores of all magnetic thin film structures may gyrate while being shifted rightward from disk centers. Herein, when a signal is input to the first structure 110, along the first path (e.g., the leftward direction), a gyration signal may be transferred from the first structure 110 to the second structure 140, and be transferred again from the second structure 140 to the third structure 120. This principle is the same as that described above in relation to FIG. 4B.

On the other hand, along the second path (e.g., the rightward direction), a gyration signal may not be transferred from the first structure 110 to the second structure 150, and transferring of the signal from the second structure 150 to the third structure 130 is also suppressed. This principle is the same as that described above in relation to FIG. 4C.

Therefore, the input signal Input of the first structure 110 is output from the third structure 120 as the output signal Output 1 and is not output from the third structure 130 as the output signal Output 2.

FIGS. 12A, 12B, 13A, and 13B include graphs showing signal transferring depending on a bias field and the amplitudes of gyration signals of a signal inputter and signal outputters depending on a frequency, in a multiplexer/ demultiplexer according to some example embodiments of the present inventive concepts.

A typical time-division demultiplexer takes one input line and then switches it to any one of a number of individual output lines at a time. In some example embodiments of the present inventive concepts, a sinusoidal field having a frequency range of 335 MHz<f<350 MHz is applied to the first structure 110, then gyration signals of the third structures 120 and 130 at both ends are checked. By switching a direct current (DC) direction of an electrode connected to the disk array (e.g., a direction of a bias field), a gyration signal propagation direction is selected.

Figure 12A:
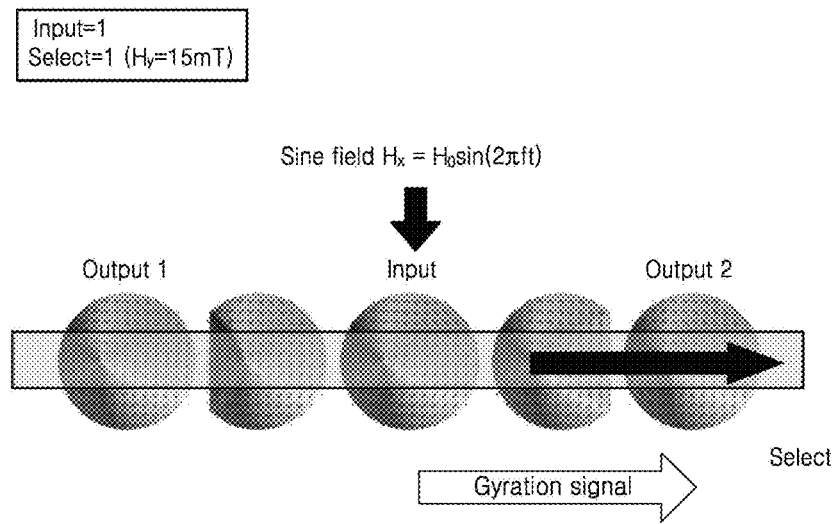
FIGS. 12A, 12B, 13A, and 13B include graphs showing signal transferring and the amplitudes of gyration signals in a signal inputter and signal outputters depending on a frequency and a bias field, in a multiplexer/demultiplexer according to some example embodiments of the present inventive concepts.

Initially, referring to FIG. 12A, while a static magnetic field of $H_y$=15 mT is being applied, (e.g., Select=1), a gyration signal is excited by applying a sinusoidal field of $H_0$=0.2 mT as an input signal to the first structure 110 (e.g., Input=1). Similarly to FIG. 11B, because a core of the second structure 140 is displaced toward a flat edge and a core of the second structure 150 is displaced toward a round edge, the input signal of the first structure 110 may be transferred along the second path (e.g., the rightward direction) to the second structure 150 and thus the output signal Output 2 may be output from the third structure 130.

Figure 12B:
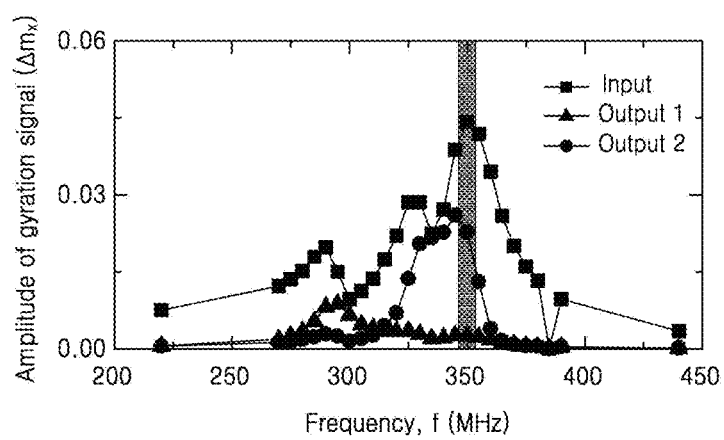

Referring FIG. 12B, it is shown that a gyration signal ratio of Output 1 to Output 2 in a frequency range of 330 MHz<f<350 MHz corresponds to about 10 dB.

Figure 13A:
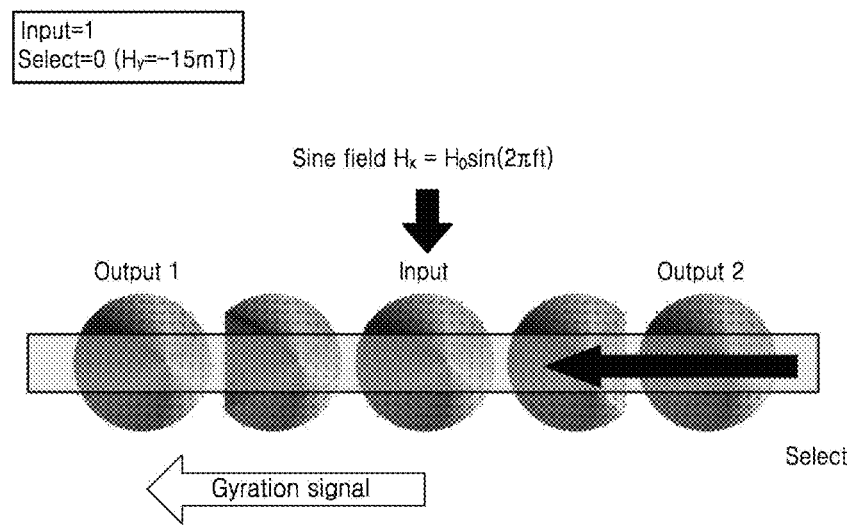

Then, referring to FIG. 13A, while a static magnetic field of $H_y$=−15 mT is being applied, (e.g., Select=0), a gyration signal is excited by applying a sinusoidal field of $H_0$=0.2 mT as an input signal to the first structure 110 (e.g., Input=1). Similarly to FIG. 11C, because a core of the second structure 140 is displaced toward a round edge and a core of the second structure 150 is displaced toward a flat edge, the input signal of the first structure 110 may be transferred along the first path (e.g., the leftward direction) to the second structure 140 and thus the output signal Output 1 may be output from the third structure 120.

Figure 13B:
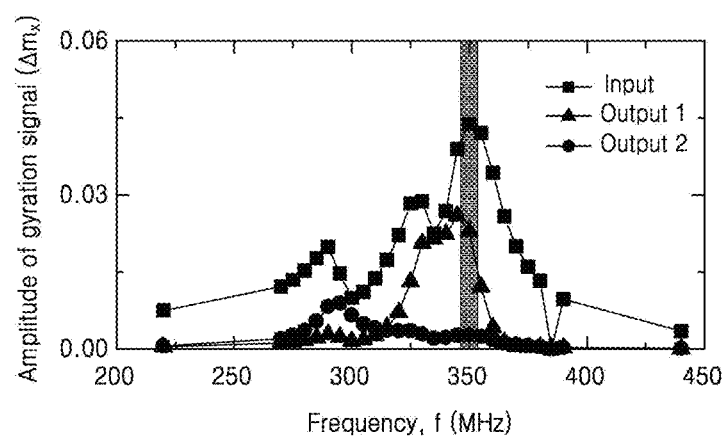

Referring to FIG. 13B, it is shown that a gyration signal ratio of Output 2 to Output 1 in a frequency range of 330 MHz<f<350 MHz corresponds to about 10 dB.

The operation described above in relation to FIGS. 12A-12B and 13A-13B is consistent with the truth table shown in FIG. 10B. When the input signal is applied to the first structure 110 (e.g., Input=1) and when $H_y$=−15 mT (e.g., Select=0), the output signal Output 1 is output from the third structure 120. When the input signal is applied to the first structure 110 (e.g., Input=1) and when $H_y$=15 mT (e.g., Select=1), the output signal Output 2 is output from the third structure 130.

Accordingly, it is shown that a channel of data transmission may be switched and a time-division multiplexer/demultiplexer may be implemented according to some example embodiments of the present inventive concepts.

Figure 14A:
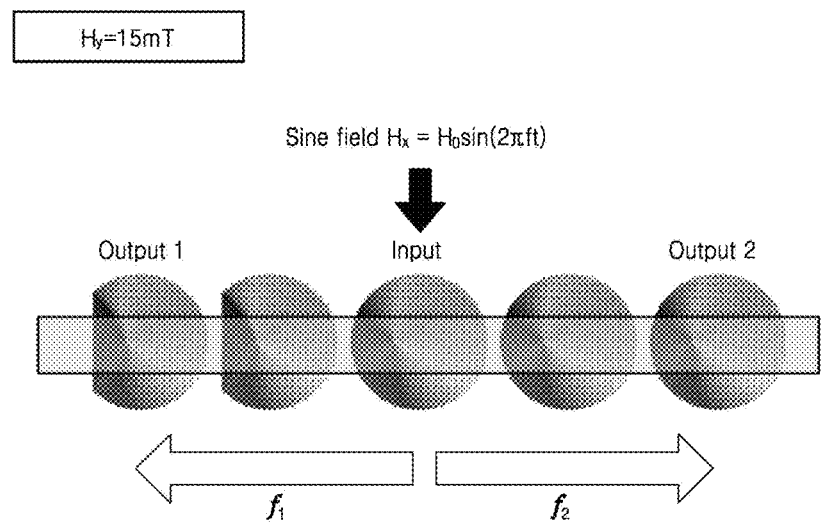
FIGS. 14A and 14B include graphs showing signal transferring and the amplitudes of gyration signals in a signal inputter and signal outputters depending on a frequency and a bias field, in a multiplexer/demultiplexer according to some example embodiments of the present inventive concepts.
Figure 14B:
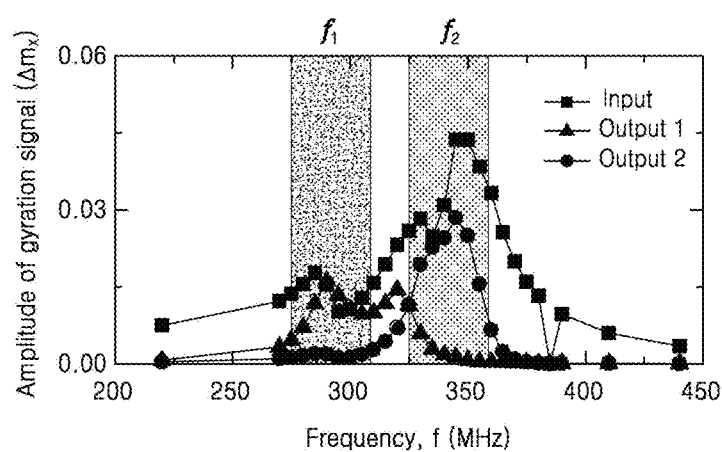

FIGS. 14A and 14B include graphs showing signal transferring depending on a bias field and the amplitudes of gyration signals in a signal inputter and signal outputters depending on a frequency, in a multiplexer/demultiplexer according to some example embodiments of the present inventive concepts.

Referring to FIG. 14A, in some example embodiments, the second structures may include a plurality of second structures, the third structures may include a plurality of third structures, and the plurality of second structures and the plurality of third structures may be on different paths (e.g., leftwards or rightwards paths as shown in FIG. 14A) of the plurality of paths. As shown in FIG. 14A, the plurality of paths may include two paths that are connected in a straight line to face each other (e.g., extend along a common axis in opposite, left and right directions), where the two paths include a first path and a second path, the first structure may be positioned between the first path and the second path, the plurality of second structures may be spaced apart from each other along the first path from the first structure (e.g., the left path shown in FIG. 14A) where the first structure may be the centermost structure in FIG. 14A, and the plurality of third structures may be spaced apart from each other along the second path from the first structure (e.g., the right path shown in FIG. 14A). As shown in FIG. 14A, respective asymmetrical portions of the plurality of second structures may be spaced apart from each other and may face outward in an extension direction of the path away from the first structure (e.g., in the leftward direction away from the first structure which is the centermost structure as shown in FIG. 14A).

Referring to FIG. 14A, the first structure 110 may be positioned between the first path (e.g., the leftward direction) and the second path (e.g., the rightward direction), a plurality of second structures may be positioned to be spaced apart from each other along the first path, and a plurality of third structures may be positioned to be spaced apart from each other along the second path. Flat edges of the plurality of second structures may be positioned to face outward in an extension direction of the first path (e.g., the leftward direction). $H_y$=15 mT may be fixed and an input signal with varied frequency may be applied to the first structure 110.

Cores of all second structures of the first path (e.g., the leftward direction) may be displaced toward the flat edges and thus the structures in the first path may exhibit lower resonant frequencies than the first structure 110. On the other hand, all third structures of the second path (e.g., the rightward direction) may exhibit higher frequencies than the first structure 110. As such, the first path (e.g., the leftward direction) may serve as a channel at a frequency $f_1$ and the second path (e.g., the rightward direction) may serve as a channel at a frequency $f_2$ higher than the frequency $f_1$.

As shown in FIG. 14B, Output 1 exhibits the highest amplitude when $f_1$=290 MHz and Output 2 exhibits the highest amplitude when $f_2$=345 MHz. A gyration signal ratio of Output 1 to Output 2 is 9.25 dB at $f_1$ and a gyration signal ratio of Output 2 to Output 1 is 13.4 dB at $f_2$.

For example, referring to FIGS. 14A and 14B, a multiplexer/demultiplexer may include the first, second, and third magnetic thin film structures of the first to third structures that are located on an xy plane such that the xy plane intersects each of the first, second, and third magnetic thin film structures, and the multiplexer/demultiplexer may be configured to cause a signal to be transferred along the first path or the second path in response to a magnetic field (e.g., $H_y$) being applied to the first, second, and third magnetic thin film structures in a +y axis direction and/or −y axis direction in relation to the xy plane, and the multiplexer/demultiplexer may be configured to cause the signal to be transferred along the first path or the second path based on a frequency band of an input signal of the first structure (e.g., the centermost structure shown in FIG. 14A), such that the multiplexer/demultiplexer may be configured to cause the signal to be transferred along the first path (e.g., leftward path in FIG. 14A) in response to a frequency of the input signal of the first structure being a first frequency (e.g., $f_1$), the multiplexer/demultiplexer is configured to cause the signal to be transferred along the second path (e.g., rightward path in FIG. 14A) in response to the frequency of the input signal of the first structure being a second frequency (e.g., $f_2$), and the first frequency (e.g., $f_1$) is lower than the second frequency (e.g., $f_2$).

Accordingly, it is shown that a frequency-division multiplexer/demultiplexer may be implemented according to some example embodiments of the present inventive concepts.

As such, the signal transferring device according to some example embodiments of the present inventive concepts (e.g., Type I) may switch "on" and "off" propagation of a gyration signal depending on a bias field direction. According to the present inventive concepts, a signal transferring device using magnetic thin film structures having low energy consumption and easily-controllable wave characteristics may be implemented and thus signals may be selectively and reliably transferred.

As described above, according to some example embodiments of the present inventive concepts, a signal transferring device using magnetic thin film structures having low energy consumption and easily-controllable wave characteristics may be implemented.

In addition, according to some example embodiments of the present inventive concepts, signals may be selectively and reliably transferred.

Furthermore, according to some example embodiments of the present inventive concepts, time-division multiplexing/demultiplexing and frequency-division multiplexing/demultiplexing may be performed.

However, the scope of the present inventive concepts is not limited to the above-described effects.

Figure 15:
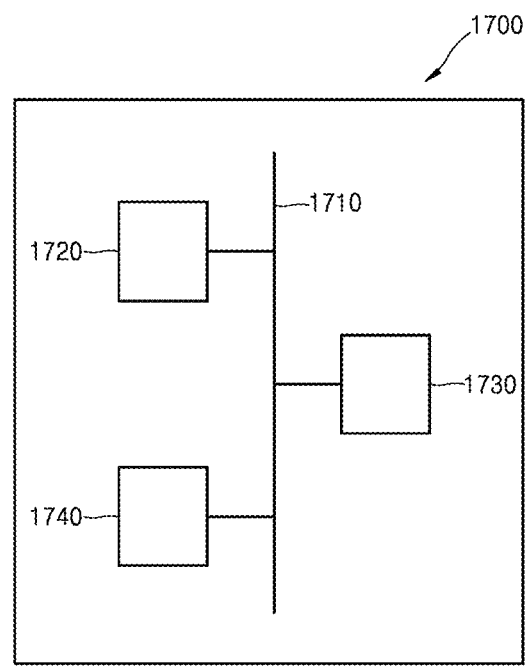
FIG. 15 is a schematic view of an electronic device according to some example embodiments.

FIG. 15 is a schematic view of an electronic device according to some example embodiments.

Referring to FIG. 15, an electronic device 1700 may include a processor 1720, a memory 1730, and a communication interface 1740 (e.g., an input/output interface) that are electrically coupled together via a bus 1710. The communication interface 1740 may include, for example a wireless network communication transceiver and/or a wired network communication transceiver. Any of the processor 1720, the memory 1730, and/or the communication interface 1740 may include any of the signal transferring devices, multiplexers, demultiplexers, and/or multiplexer/demultiplexers according to any of the example embodiments. The memory 1730, which may be a non-transitory computer readable medium, may store a program of instructions. The processor 1720 may execute the stored program of instructions to perform one or more functions. For example, the processor 1720 may be configured to process an input signal received at the electronic device 1700 via the communication interface 1740 and/or generate an output signal to be transmitted from the electronic device 1700 via the communication interface based on such as processing.

One or more of the processor 1720, memory 1730, or communication interface 1740 may be included in, include, and/or implement one or more instances of processing circuitry such as hardware including logic circuits, a hardware/software combination such as a processor executing software; or any combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein (e.g., memory 1730) may include a non-transitory computer readable storage device, for example a solid state drive (SSD), storing a program of instructions, and the one or more instances of processing circuitry may be configured to execute the program of instructions to implement the functionality of some or all of any of the electronic device 1700, processor 1720, memory 1730, communication interface 1740, or the like (e.g., the functionality of any of the signal transferring devices, multiplexers, any portion thereof, or the like) according to any of the example embodiments as described herein.

While the present inventive concepts have been particularly shown and described with reference to some example embodiments thereof, it will be understood by one of ordinary skill in the art that various changes in form and details may be made therein without departing from the scope of the present inventive concepts as defined by the following claims.

What is claimed is:

1. A signal transferring device, comprising:
  a first structure that includes a first magnetic thin film structure having a first magnetic vortex configured to receive a signal as an input signal;
  a second structure that is spaced apart from at least one side of the first structure, the second structure including a second magnetic thin film structure having a second magnetic vortex configured to transfer the signal; and
  a third structure that is spaced apart from at least one side of the second structure, the third structure including a third magnetic thin film structure having a third magnetic vortex configured to output the signal from the signal transferring device,
  wherein
    the first and third structures have a symmetrical shape, and
    the second structure has an asymmetrical shape.

2. The signal transferring device of claim 1, wherein the first and third structures have a disk shape and the second structure has a separate disk shape comprising at least one asymmetrical portion.

3. The signal transferring device of claim 2, wherein the separate disk shape includes at least one flat edge.

4. The signal transferring device of claim 1, wherein an asymmetrical portion of the second structure faces the third structure.

5. The signal transferring device of claim 1, wherein,
  the first, second, and third magnetic thin film structures are located on an xy plane such that the xy plane intersects each of the first, second, and third magnetic thin film structures, and
  the signal transferring device is configured to cause a vortex core of the first structure to
    exhibit three coupled modes in response to a first magnetic field being applied to the first, second, and third magnetic thin film structures in a +y axis direction in relation to the xy plane, and
    exhibit two coupled modes in response to a second magnetic field being applied to the first, second, and third magnetic thin film structures in a −y axis direction in relation to the xy plane.

6. The signal transferring device of claim 1, wherein,
  the first, second, and third magnetic thin film structures are located on an xy plane such that the xy plane intersects each of the first, second, and third magnetic thin film structures, and the signal transferring device is configured to
- cause the input signal received at the first structure to be transferred via the second structure to the third structure in response to a first magnetic field being applied to the first, second, and third magnetic thin film structures in a +y axis direction in relation to the xy plane, and
- cause the input signal received at the first structure to not be transferred to the third structure in response to a second magnetic field being applied to the first, second, and third magnetic thin film structures in a −y axis direction in relation to the xy plane.

7. The signal transferring device of claim 1, wherein
the signal transferring device is configured to cause resonant frequencies of the first and third structures to increase in response to respective vortex cores of the first and third structures being shifted outward from respective disk centers of the first and third structures, and
the signal transferring device is configured to cause a resonant frequency of the second structure to decrease in response to a vortex core of the second structure being shifted outward from a disk center of the second structure.

8. A multiplexer, comprising:
a signal inputter at respective first ends of a plurality of paths; and
a separate signal outputter at a second end of each path of the plurality of paths,
wherein a first structure that includes a first magnetic thin film structure is on the signal inputter,
wherein at least one structure of second structures and third structures are on each path extending to the separate signal outputter of the path, each second structure of the second structures including a separate second magnetic thin film structure, each third structure of the third structures including a separate third magnetic thin film structure, and
wherein the first and third structures each have a symmetrical shape and the second structure has an asymmetrical shape.

9. The multiplexer of claim 8, wherein, for each path of the plurality of paths,
one second structure of the second structures and one third structure of the third structures are spaced apart from each other on the path, and
the one third structure is on the separate signal outputter of the path.

10. The multiplexer of claim 9, wherein
the plurality of paths includes two paths that are connected in a straight line to face each other, the two paths including a first path and a second path,
the first structure is between the first path and the second path,
a first set of second and third structures are sequentially spaced apart from each other along the first path from the first structure, and
a second set of second and third structures are sequentially spaced apart from each other along the second path from the first structure.

11. The multiplexer of claim 9, wherein an asymmetrical portion of the one second structure faces the one third structure.

12. The multiplexer of claim 10, wherein,
the first, second, and third magnetic thin film structures are located on an xy plane such that the xy plane intersects each of the first, second, and third magnetic thin film structures, and
the multiplexer is configured to
- cause an input signal received at the first structure to be transferred via a second structure that is on the second path to a third structure that is on the second path, along the second path, in response to a first magnetic field being applied to the first, second, and third magnetic thin film structures in a +y axis direction in relation to the xy plane, and
- cause the input signal received at the first structure to be transferred via a second structure that is on the first path to a third structure that is on the first path, along the first path, in response to a second magnetic field being applied to the first, second, and third magnetic thin film structures in a −y axis direction in relation to the xy plane.

13. The multiplexer of claim 8, wherein the first and third structures each have a disk shape and the second structures each have a separate disk shape comprising at least one asymmetrical portion.

14. The multiplexer of claim 13, wherein the separate disk shape includes at least one flat edge.

15. The multiplexer of claim 8, wherein the second structures include a plurality of second structures, the third structures include a plurality of third structures, and the plurality of second structures and the plurality of third structures are on different paths of the plurality of paths.

16. The multiplexer of claim 15, wherein
the plurality of paths includes two paths that are connected in a straight line to face each other, the two paths including a first path and a second path,
the first structure is between the first path and the second path,
the plurality of second structures are spaced apart from each other along the first path from the first structure, and
the plurality of third structures are spaced apart from each other along the second path from the first structure.

17. The multiplexer of claim 15, wherein respective asymmetrical portions of the plurality of second structures are spaced apart from each other and face outward in an extension direction of a path away from the first structure.

18. The multiplexer of claim 17, wherein,
the plurality of paths includes two paths that are connected in a straight line to face each other, the two paths including a first path and a second path,
the first, second, and third magnetic thin film structures are located on an xy plane such that the xy plane intersects each of the first, second, and third magnetic thin film structures,
the multiplexer is configured to cause a signal to be transferred along the first path or the second path in response to a magnetic field being applied to the first, second, and third magnetic thin film structures in a +y axis direction in relation to the xy plane, and
the multiplexer is configured to cause the signal to be transferred along the first path or the second path based on a frequency band of an input signal of the first structure, such that
the multiplexer is configured to cause the signal to be transferred along the first path in response to a frequency of the input signal of the first structure being a first frequency, the multiplexer is configured to cause the signal to be transferred along the second path in response to the frequency of the input signal of the first structure being a second frequency, and the first frequency is lower than the second frequency.

* * * * *